United States Patent
Tichenor et al.

[11] Patent Number: 6,031,598
[45] Date of Patent: Feb. 29, 2000

[54] EXTREME ULTRAVIOLET LITHOGRAPHY MACHINE

[75] Inventors: Daniel A. Tichenor, Castro Valley; Glenn D. Kubiak, Livermore; Steven J. Haney, Tracy; Donald W. Sweeney, San Ramon, all of Calif.

[73] Assignee: Euv LLC, Santa Clara, Calif.

[21] Appl. No.: 09/161,353

[22] Filed: Sep. 25, 1998

[51] Int. Cl.$^7$ .............................. G03B 27/54; G03B 27/74
[52] U.S. Cl. ................................................. 355/67; 355/68
[58] Field of Search .................................. 355/67, 53.01, 355/53, 53.54, 18, 30, 71, 68

[56] References Cited

U.S. PATENT DOCUMENTS 5,298,939  3/1994  Swanson et al. ........................... 355/30
5,559,584  9/1996  Miyaji et al. ............................... 355/67

*Primary Examiner*—Safet Metjahic
*Assistant Examiner*—Hung Henry Nguyen
*Attorney, Agent, or Firm*—Lafayette E. Carnahan

[57] ABSTRACT

An extreme ultraviolet lithography (EUVL) machine or system for producing integrated circuit (IC) components, such as transistors, formed on a substrate. The EUVL machine utilizes a laser plasma point source directed via an optical arrangement onto a mask or reticle which is reflected by a multiple mirror system onto the substrate or target. The EUVL machine operates in the 10–14 nm wavelength soft x-ray photon. Basically the EUV machine includes an evacuated source chamber, an evacuated main or project chamber interconnected by a transport tube arrangement, wherein a laser beam is directed into a plasma generator which produces an illumination beam which is directed by optics from the source chamber through the connecting tube, into the projection chamber, and onto the reticle or mask, from which a patterned beam is reflected by optics in a projection optics (PO) box mounted in the main or projection chamber onto the substrate. In one embodiment of a EUVL machine, nine optical components are utilized, with four of the optical components located in the PO box. The main or projection chamber includes vibration isolators for the PO box and a vibration isolator mounting for the substrate, with the main or projection chamber being mounted on a support structure and being isolated.

20 Claims, 11 Drawing Sheets

EXTREME ULTRAVIOLET LITHOGRAPHY MACHINE

The United States Government has rights in this invention pursuant to a contract between the United States Department of Energy and the Sandia National Laboratories.

BACKGROUND OF THE INVENTION

The present invention relates to optical lithography, particularly to the fabrication of integrated circuit components (IC) utilizing optical lithography, and more particularly to an extreme ultraviolet lithography machine using 10–14 nm extreme ultraviolet photons for initial chip size fabrication of 100 nm, reduced from current 0.25 microns, with scaling down to possibly 30 nm.

For nearly 3 decades, the number of transistors contained on an IC has grown exponentially, doubling on the average of every 18 months. In the early 1990's the Semiconductor Industry Association (SIA) developed the first national technology roadmap outlining the equipment and technology needs for continuing to support the increase in IC complexity. With each new technology generation, lithography has become an even more important key driver for the semiconductor industry because of smaller feature sizes and tighter overlay requirements and also because of the increasing lithography tool costs relative to total manufacturing costs. Although conventional optical lithography is expected to support the roadmap through the end of the decade, new approaches will be required to support manufacturing of 100 nm size chip technologies, currently at 0.25 microns, beyond the year 2004.

A major industry direction has focused on the possible development of cameras to print sub 130 nm features with a greater process latitude than afforded by 248 nm or 193 nm cameras. This has led to considering 157 nm, 126 nm and 13 nm wavelengths for which there are potentially useful illumination sources. The advantage of migrating to shorter wavelengths is that, for constant resolution and $k_1$ (an imperical process dependent parameter), depth of focus (DOF) scales inversely with wavelength.

Below 193 nm wavelengths transmissive optical elements composed of fused silica exhibit high losses and alternate materials must be considered. Although $CaF_2$ and $LiF_2$ materials have been identified for possible use in 157 nm and 126 nm systems, materials issues associated with quality, size and stability tend to preclude the design of a transmissive system. In addition, large NA (numerical aperture) systems would be required, since both 157 nm and 126 nm systems provide only marginal advantage in terms of the required $k_1$ over a 193 nm system with an NA of 0.6. A 157 nm system provides only a 20% larger DOF than a 193 nm system for the same resolution. Because of the high transmissive losses, all reflective imaging systems and use of $CaF_2$ must be utilized; these cameras will require five or more mirrors. The mirrors must be steep and highly aspheric to avoid obscuration of the light beams (the mirrors tend to get in the way of one another) and the used portions of many mirrors will be located far off the axis of the optical system. Generally speaking, as the NA of the camera is increased, the used mirror segments move further off axis and the mirror asphericity must be increased to compensate for the aberrations induced by non-normal incidence angles. In a recent Sematech meeting on "All-Reflective Imaging Systems for 0.13 Micron Lithography" it was reported that the aberrations, which must be compensated for with asphericity, grow at a relatively high power of the camera NA, at least as (NA). As NA increases, the mirrors become larger and more aspheric. Aspheric departures from a best fit sphere become very large, more than 100 microns for systems with NA's in excess of 0.5. As a result, there seems to be general agreement that all-reflective systems for 157 nm and 126 nm having NAs as large as 0.5 are not manufacturable on the time scale required. Alternately, 13 nm imaging systems can operate at small NA, from 0.1 to 0.2, and achieve the necessary resolution.

The first papers proposing the use of soft x-ray or EUV radiation (wavelengths from 2 nm through 50 nm) for projection lithography were published in 1988. Lithography systems for use at 4.5 nm and 15.37 nm were described by research groups from Lawrence Livermore National Laboratory (LLNL) and Bell Laboratory, respectively. Both research groups described all-reflective projection lithography systems using multilayer-coated mirrors and reflection masks. Shortly thereafter in 1989, a Japanese research group demonstrated projection imaging of 0.5 micron features using 13 nm radiation and Mo/Si multilayer reflective coatings on a reflection mask and on the camera mirrors. The first demonstration of the technology's potential and of nearly diffractive-limited imaging followed in 1990 with the printing of features as small as 50 nm in PMMA resist using 13 nm radiation by the Bell Laboratory group. Interest in the technology, originally called soft x-ray projection lithography (SXPL), grew rapidly spurred by a number of focused workshops and topical meetings. In the U.S. the efforts at LLNL and Bell Laboratory increased, and major research groups at Sandia National Laboratories (SNL) and at Lawrence Berkeley National Laboratory (LBNL) joined this effort. The various research groups established advisory boards with strong participation by the lithography tool manufacturers and the IC manufacturers to provide oversight and guidance for the development work. Emphasis was placed on the work relevant to industry needs. It also became apparent that SXPL was being confused with proximity x-ray lithography. As a result, the name of the technology was changed to extreme ultraviolet (EUV) lithography. In the 1995–96 time frame, the various research groups worked to coalesce their work into a single "national program". Simultaneously, support for technology transfer within the national laboratories (LLNL, SNL and LLBL) and for lithograph research within Bell Laboratory declined. In the meantime, research personnel within the semiconductor industry became convinced that the EUVL technology was demonstrating great promise. As a result, a consortium of semiconductor manufacturers, the EUV Limited Liability Company (EUVLLC), composed of Advanced Micro Devices, Motorola, and Intel Corporation, was formed to provide funding and guidance for the development of EUVL within the national laboratories. At the same time, the previously independent EUVL research groups with LLNL, SNL, and LBNL joined together to form a "Virtual National Lab" (VNL), working as a single entity with combined efforts to implement the EUVL concept, which is an extension of optical lithography to dramatically shorten wavelengths (10–14 nm, particularly 13 nm).

Extreme ultraviolet lithography (EUVL), using 10–14 nm extreme ultraviolet photons, is one promising technology which builds on the industrial optical experience, since it is an extension of optical lithography to dramatically shorten wavelengths. Initially this EUVL technology will support IC fabrication at 100 nm. Scaling is expected to support several technology generations down to possibly 30 nm.

There are several advantages of EUV lithography over other technologies. EUV parallels and builds on the conventional optical lithography experience base. 1) Imaging follows the trends of conventional optics in terms of resolution and depth of focus with numerical aperture (NA) and is expected to scale down to 30 nm. 2) The 4× masks are fabricated on robust substrates, not membranes, and are easier to write than 1× or segmented masks, and use conventional silicon processing to define the final geometric patterns on the mask. 3) The use of low NA optics provides good depth of focus for isolated and dense lines simultaneously, minimizing the need for mask biasing. 4) The technology provides a granular tool solution when a laser produced plasma or other discrete source is used. 5) Photo-resists used by the 193 nm technology are extendable to EUV wavelengths (10–14 nm). 6) The technology is fully compatible with larger circuit design rules and could be introduced selectively at 130 nm. In addition, the x-ray syorchrotron sources may be used for EUVL with an appropriate condenser design.

The present invention involves an EUVL machine or system for wavelengths in the 10–14 nm range, and particularly the 13 nm region. The EUVL machine of this invention encompasses an evacuated source chamber and a main projection chamber. In the illustrated embodiment, the main or projection chamber is mounted on a support block and the chambers are connected by a transport tube, with each of the chambers having a separate vacuum system. In the illustrated embodiment, the light beam from a laser source to the substrate is reflected nine time, with four of the reflective optics being mounted in a projection optics box located in the projection or main chamber between the reticle and the wafer or substrate. The projection optic box and the wafer support structure are provided with vibration isolators.

SUMMARY OF THE INVENTION

It is an object of the present invention to provide an imaging system operating in the 13 nm wavelength region that can operate at small NA, from 0.1–0.2, and achieve the necessary resolution.

A further object of the invention is to provide an EUVL machine operating in the 13 nm wavelength region.

A further object of the invention is to provide an EUVL machine having multiple reflective optics which have a reflectivity of greater than 65% and all reflect at essentially the same wavelength.

Another object of the invention is to provide an EUVL machine having a pair of evacuated chambers and interconnected by a beam transport tube, one of the chambers containing a plasma generator and reflective optics for directing a laser beam through a plasma generator and into the transport tube, with the other of the chambers including a mask, substrate, and reflective optics for directing the beam from the transport tube onto the mask and then onto the substrate.

Another object of the invention is to provide an EUV machine having a source chamber and a projection chamber containing a reticle/wafer stage system, a projection optics box, a wafer stage methology system, with vibration isolators for the projection optics box and the metrology system.

Other objects and advantages of the present invention will become apparent from the following description and accompanying drawings. Basically, the invention involves an EUVL machine having a source chamber and a main or projection optics chamber interconnected by a transport tube. In the illustrated embodiment, the projection chamber is mounted on a support to enable the desired optical beam transfer arrangement. The source chamber includes an illuminator support structure, a collector support structure, pupil optics support, a collector assembly, a plasma generator, a filter assembly, a pupil optics assembly located adjacent one end of the transport tube, and a reflector assembly for directing laser light energy onto the collector and plasma generator for producing an illumination beam which is reflected through the transport tube. The main or projection chamber contains a reticle support structure, a reticle, a projection optics frame, having vibration isolators, a projection optics box, a wafer support structure and isolation mountings, a wafer or substrate, interferometers, and reflective optics for directing the illumination beam from the transport tube onto the reticle, and from the reticle via to projection optics box onto the wafer or substrate. In the illustrated embodiment from the laser to the wafer, the beam is reflected via nine (9) optical components including the reticle.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to an EUVL machine for producing integrated circuit (IC) components, such as transistors, formed on a substrate. The machine of this invention uses a high powered laser which emits an energy beam which is directed onto a gas (plasma generator) under pressure creating an EUV illumination beam directed by mirrors onto a mask or reticle having a desired pattern, producing a patterned beam which is directed by mirrors onto a wafer for etching the pattern of the reticle on the wafer. In this embodiment, nine mirrors are utilized with four of the nine mirrors directing the patterned beam onto the wafer. The EUVL machine of this invention utilizes two chambers, a source chamber and a main chamber, interconnected by a beam transfer tube, with both chambers including a vacuum system. The laser energy beam is directed by a reflector onto a plasma generator in the source chamber, with a reticle support assembly and a wafer support assembly being located in the main chamber, and the four mirrors between the reticle and wafer being mounted in a projection optics box which is vibration isolated and kinematic mounted.

Figure 1:
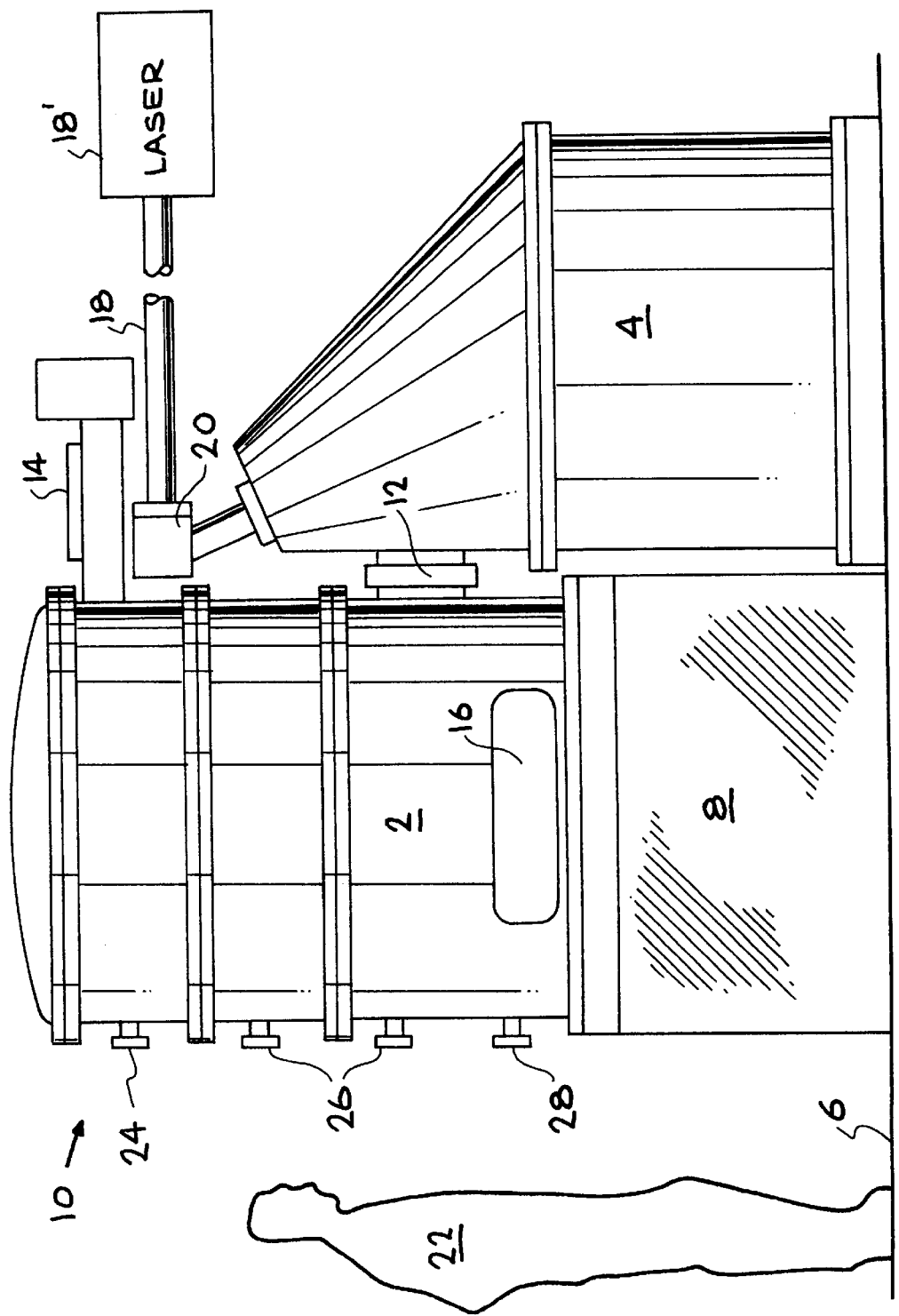
FIG. 1 is an overall view of an extreme ultraviolet lithography (EUVL) machine.

Referring now to the drawings, FIG. 1 illustrates an overall view of the EUVL machine of the present invention, indicated generally at 10 comprising a main vacuum or projection chamber 2 and a source vacuum chamber 4 located on floor 6 of a clean room, with main chamber 2 being mounted on a pedestal 8. The overall machine is about eight feet tall, and the pedestal 8, which is about 30" tall, is constructed of a heavy mass and provides vibrational damping. The interior of main chamber 2 is divided into three zones, the top most zone, the reticle zone, has a vacuum pump out port 24, which may have a capacity of about 1,000 l/s. This section of the main chamber 2 also incorporates the reticle robotics 14. Reticle robotics 14 has an airlock and permits the changing, cleaning or repair of the reticle while keeping the main chamber uncontaminated and at vacuum. Directly below the reticle zone is the projection optics zone which has two vacuum pump ports 26, each of which may have about 3,200 l/s capacity as required to maintain a low pressure to minimize EUV attenuation. Below the projection optics zone is the wafer stage zone with its vacuum pump out port 28, which may have about 1,000 l/s capacity. The wafer stage zone has a vacuum barrier that separates it from the other zones in the main chamber. This vacuum barrier incorporates a window that is transparent, for example about 50% transparent, to the extreme ultraviolet beam. This zone has a wafer stage access door 16 that permits removal of the wafer stage, which slides on an air bearing.

Source chamber 4 is in communication with main chamber 2 through airlock valve 12. This permits either chamber to be accessed without venting or contaminating the environment of the other chamber. The laser beam that generates the plasma to create the EUV beam enters the system via laser beam transport tube 18, connected to a laser 181, and which may be about 30" in length. The laser beam is directed into the upper part of source chamber 4 by a mirror in the laser turning box 20. Under normal operation the environment in the transport tube is identical to that of the optics zone. The transport tube maximizes the path length in the low attenuation environment.

Figure 2:
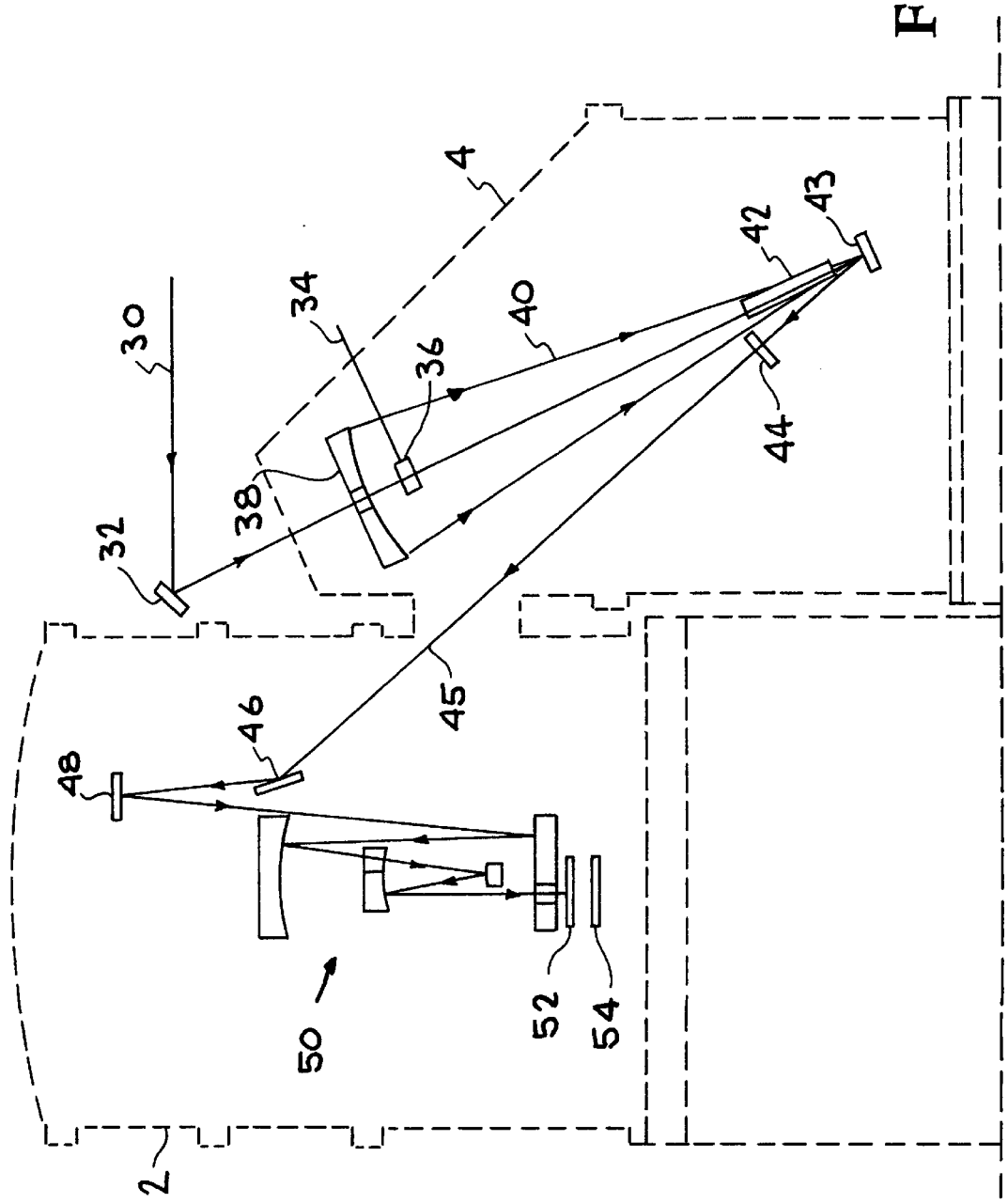
FIG. 2 illustrates the optical path of the EUVL machine of FIG. 1.

FIG. 2 shows the optical path with the main chamber and the source chamber shown in dotted outline. The laser beam 30 is directed by turning mirror 32 into the source chamber 4. A high density gas, such as Xenon, is injected into the plasma generator 36 through gas supply 34 and the interaction of the laser beam 30, and gas supply 34 creates a plasma giving off the illumination used in extreme ultraviolet lithography. The EUV is collected by segmented collector 38, that collects about 30% of the available EUV, and directed toward the pupil optics 42. The pupil optics consists of long narrow mirrors arranged to focus the rays from the collector at grazing angles onto an imaging mirror 43 that redirects the illumination beam through filter/window 44. Filter 44 passes only the desired wavelength EUV and excludes scattered laser beam light in chamber 4. The illumination beam is then reflected from the relay optics 46, another grazing angle mirror, and then illuminates the pattern on the reticle. EUV can be efficiently reflected at low grazing angle or direct reflection that is close to the axis of the beam. Angles in between tend to absorb much of the beam thereby being much less efficient. The reflected pattern from the reticle then passes through the projection optics 50 which reduces the image size to that desired for printing on the wafer. After exiting the projection optics 50, the beam passes through vacuum window 52, which is part of the wafer zone vacuum barrier mentioned in the description of FIG. 1. The beam then prints its pattern on wafer 54.

Figure 3:
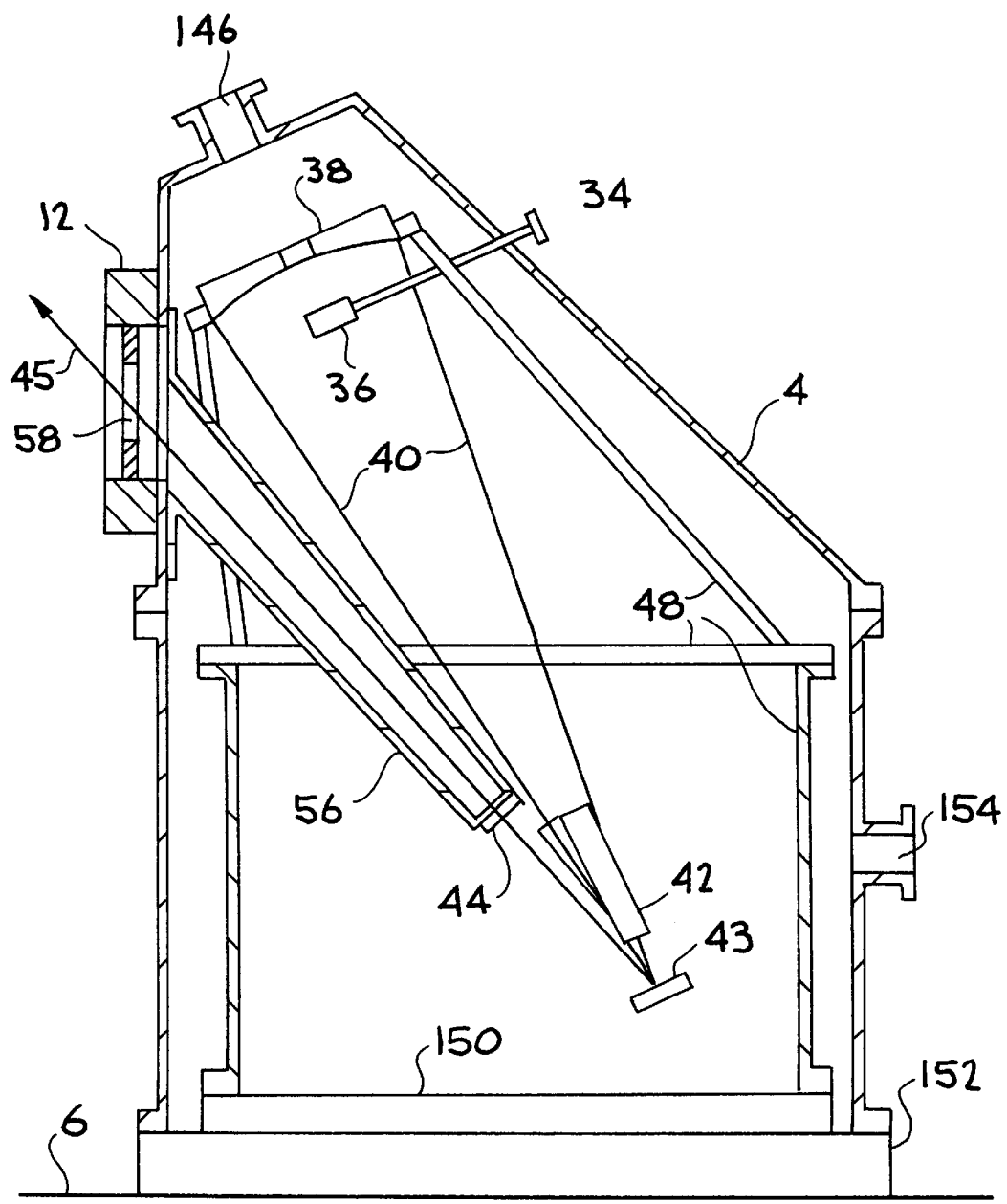
FIG. 3 illustrates details of the source chamber of the FIG. 1 machine.

FIG. 3 shows a cut away view of the source chamber 4 which, includes a support member 150, and is secured to base plate 152, which in turn stands on clean room floor 6. Chamber 4 has a vacuum pump out port 154 which connects to a vacuum source (not shown). Source chamber 4 connects to main chamber 2 (not shown here) by way of chamber to chamber valve 12. Chamber valve 12 can be used to isolate the two chambers from each other for maintenance, adjustment, or replacement of components without compromising the vacuum integrity or cleanliness of either chamber. Valve 12 incorporates a clear window that will pass visible light for alignment of the optical path. In operation, the laser beam would enter source chamber 4 through port 146 and impinge on the gas in generator 36 creating a plasma that produces the extreme ultraviolet radiation. The average laser power impinging on the gas may be about 1500 W.

The EUV is then collected by the condenser consisting of a series of aspheric mirrors that in combination with the pupil optics 42 produce a relatively small arc (about 60 degrees) of the ring image that is needed by the projection optics 50 (camera) in the most efficient manner. All the segments are so manipulated that they all fall onto the same arc needed by the camera. The combined arcs are then reflected by imaging mirror 43 and pass through filter/window 44 and thus into illumination beam transport tube 56. Filter/window 44 serves several purposes: as a filter it passes only the desired wavelength EUV, undesirable frequencies and scattered laser light are excluded from the EUV beam, which from here on will be referred to as the illumination beam 45.

Another purpose of filter/window 44 is to act as a vacuum barrier between main chamber 2 and source chamber 4. During operation the source will produce an ambient pressure of gas, such as Xenon, although the source chamber vacuum system is continuously drawing off this gas with high speed vacuum pumps, the gas must not enter the main chamber 2 and cause additional EUV attenuation. The resulting Xenon gas pressure in the source chamber is about 1 mTorr. The conditioned illumination beam 45 exits transport tube 56, passes through open valve 12 and then into main chamber 2 to follow the path shown in FIG. 2.

Figure 4:
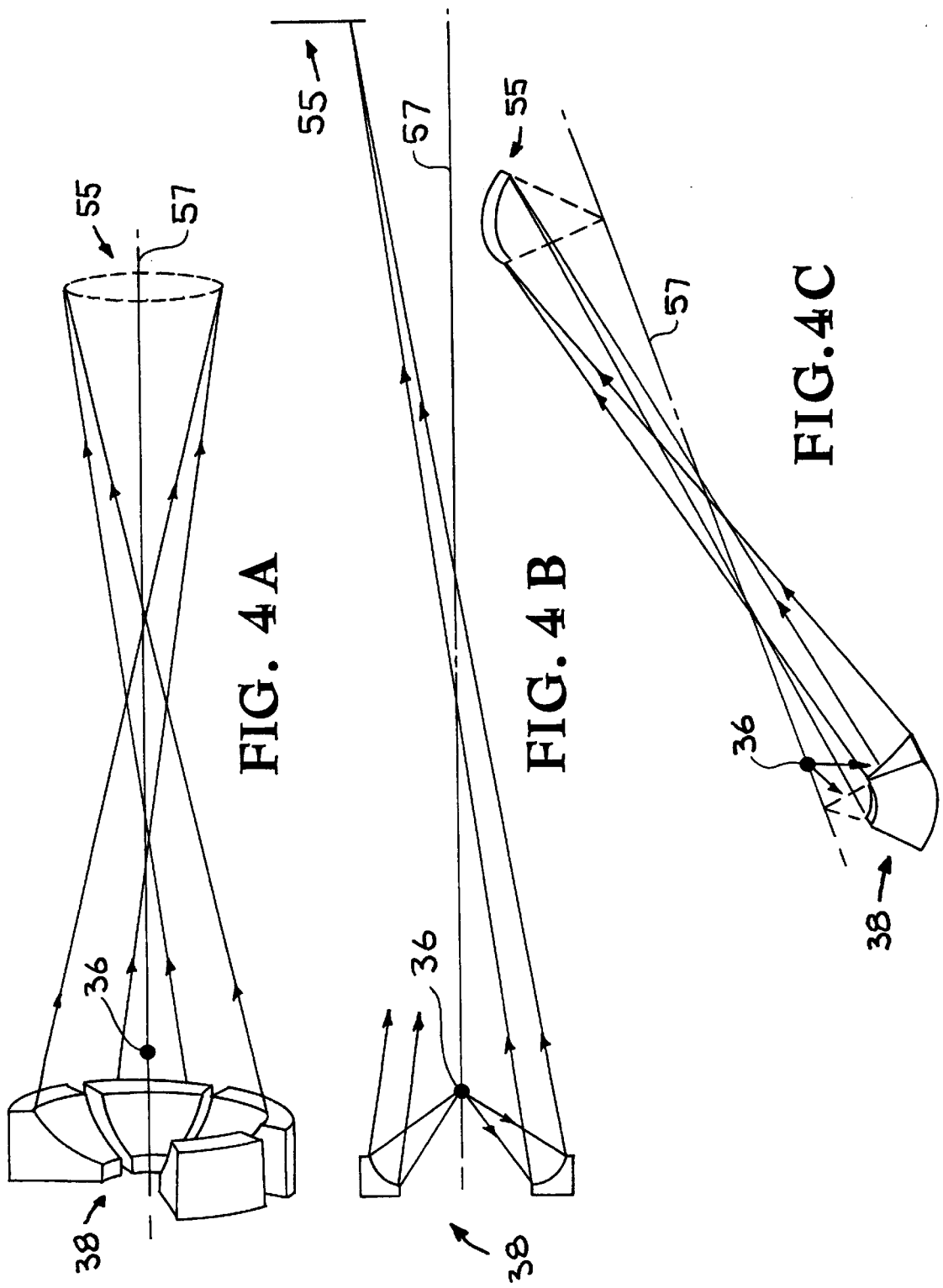
FIGS. 4A, 4B and 4C illustrate in greater detail components of the source chamber of FIG. 3.

FIG. 4A shows condenser 38 mirror segments arranged about center line 57 with plasma source 36 located on center line 57. This view shows how non-manipulated beams would form individual arcs 55.

FIG. 4B is a side view and shows how a single arc 55 is formed.

FIG. 4C is an isometric view that better shows that arc 55, one condenser mirror 38 segment, the center line 57 and source 36 are indicated. As has been described earlier, the pupil optics serve to combine the individual arcs 55 into one bright arc.

Figure 5:
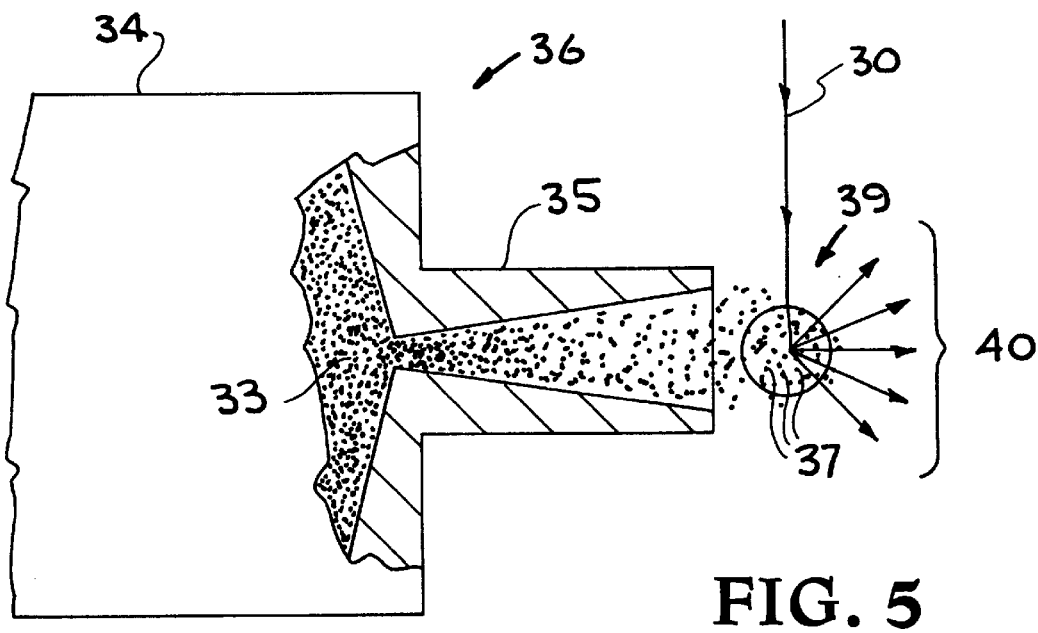
FIG. 5 shows the gas generator which is the source of the EUV beam.

FIG. 5 shows the gas generator 36 which is the source of the EUV beams 40. The plasma source shown is an ultra-low debris type. Some other source design, produce much more debris during operation and can require more maintenance than the gas plasma source. In operation, there is a Xenon gas supply 34 of high pressure gas 33, the gas expands in nozzle 35, which cools the gas creating Van der Waals molecular clusters 37 in an area 39, just beyond the nozzle 35. These clusters are then irradiated by the laser beam 30 producing EUV beams 40 which are in turn collected by the condenser 38 and eventually converted into illumination beam 45. The specific advantage in using this source is that it yields many orders of magnitude less debris and offers long uninterrupted periods of operation.

Figure 6:
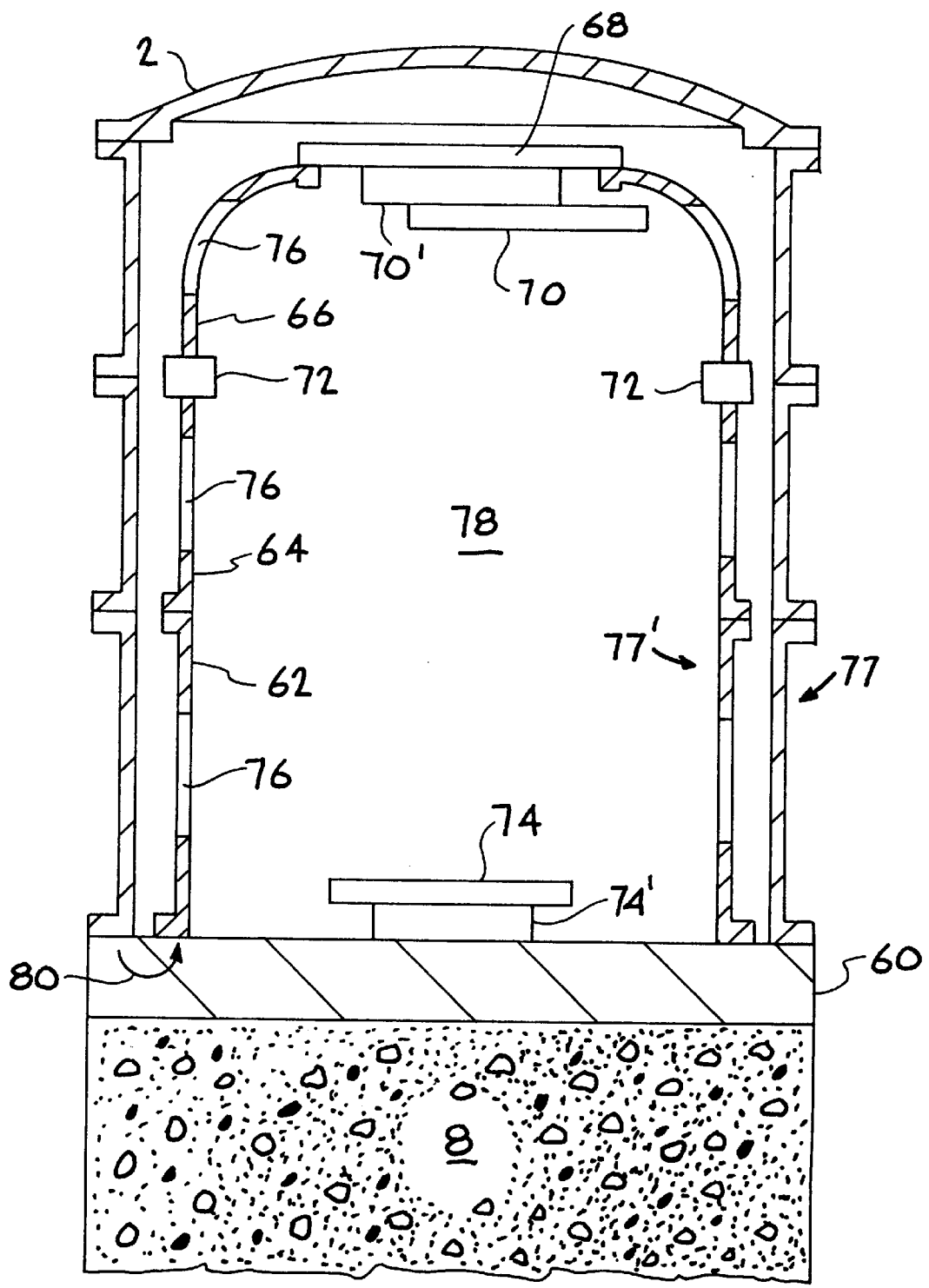
FIG. 6 illustrates in cross-section the main chamber structures of the EUVL machine of FIG. 1.

In FIG. 6 we see chamber 2, which includes spaced wall sections generally indicated at 77 and 77', is secured to base plate 60, which is in turn secured to pedestal 8. The inner volume 78 of chamber 2 is under vacuum. Also shown is the reticle stage bridge is supported by inner wall section 77', and which consists of three parts: lower stage bridge 62, middle stage bridge 64, and upper stage bridge 66. This structure supports reticle stage support structure 68 to which is fastened a reticle stage including a base 70 and carrier 70'. Upper stage bridge 66 is attached to middle stage bridge 64 with three kinematic mounts. Also shown within chamber 2 is wafer stage including a carrier 74 and a base 74 which rests upon base plate 60. The outer shell of chamber 2 acts as a vacuum barrier to the items within the chamber. Acoustic vibrations generated in the outer shell cannot propagate sound waves within the evacuated chamber interior 78. The path for acoustic vibrations would be through base plate 60. This is a massive structure and will dampen the vibrations. The path is shown by arrow 80.

Figure 7:
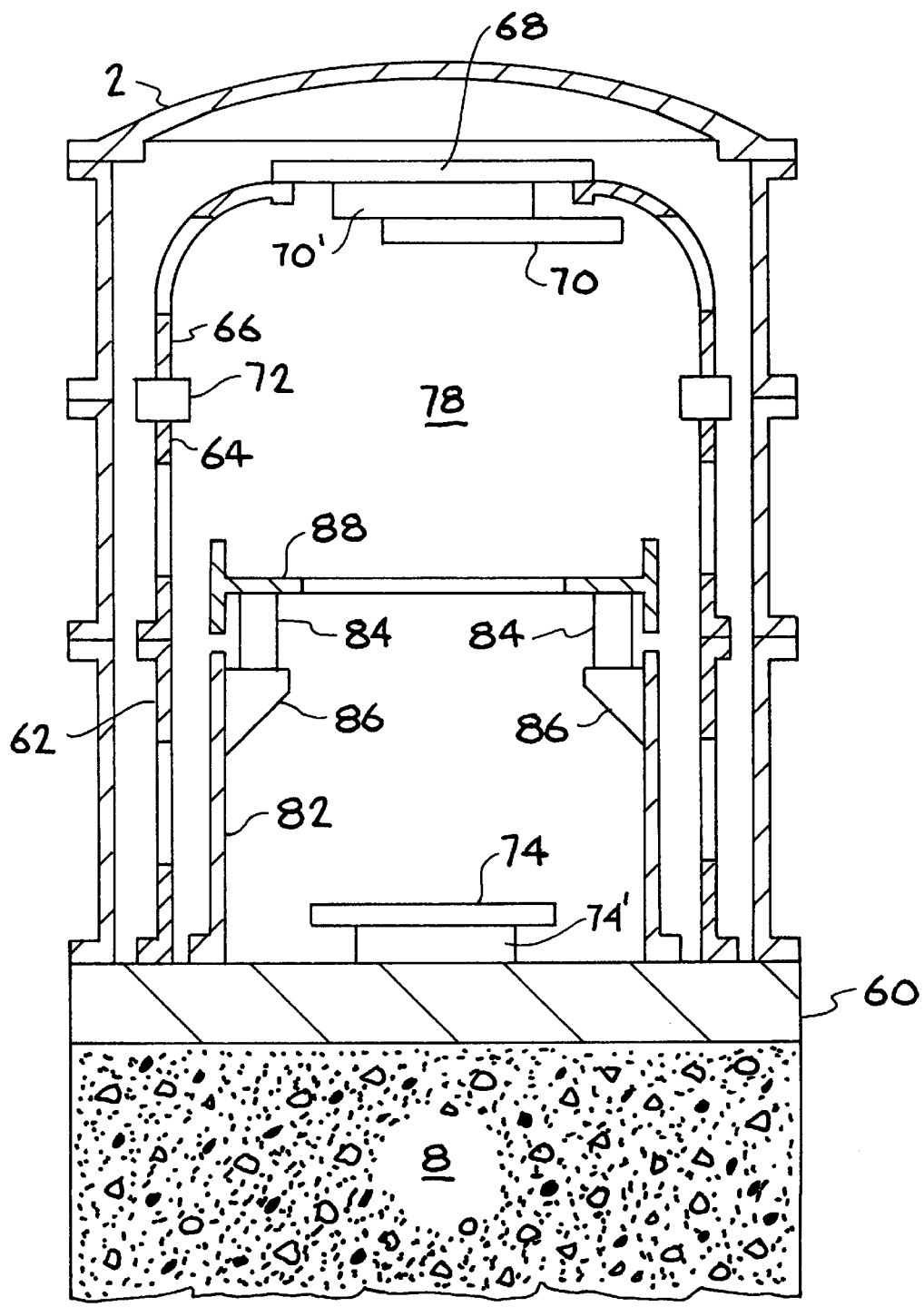
FIG. 7 illustrates the isolation system for the projection optics box support ring in the main chamber shown in FIG. 6.

FIG. 7 shows most of the same components that are shown on FIG. 6 using the same reference numerals. New components shown are isolator support structure 82, which is secured to base plate 60. Isolator support structure 82 incorporates isolator brackets 86. Isolators 84 support the project optics box support ring 88 and protect this structure from vibrations.

Figure 8:
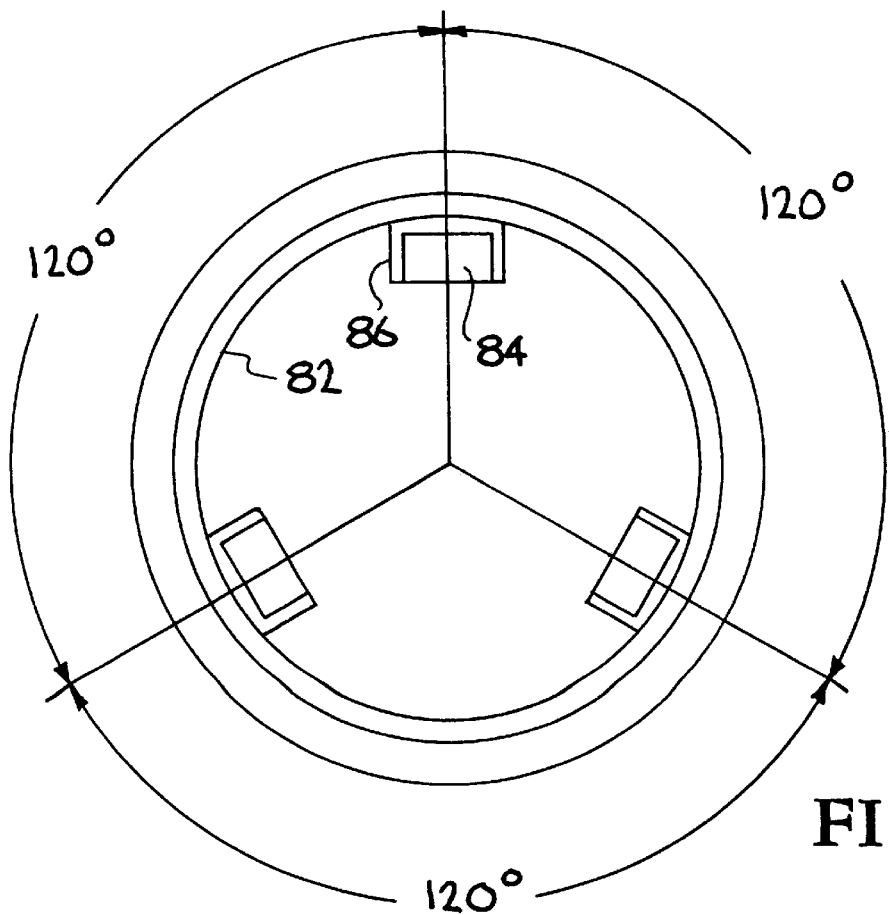
FIG. 8 illustrates a kinematic mounting system for the projection optics box support ring of FIG. 7.

FIG. 8 is a plan view of the isolators 84 that support projection optics box support ring 88. There are three isolators spaced apart at 120 degrees. This same spacing arrangement is used for both the reticle metrology tray 92 and wafer metrology 96, as well as projection optics box 102, described hereinafter. These last described items make use of kinematic mounting. Kinematic mounting systems have long been known to provide an economical and dependable method for attaining high repeatability and accurate positioning in structures. A kinematic mounting system provides the number of constraints required to locate an object in space relative to its supporting platform. Precision machines and instruments are frequently mounted in this way so as not to be influenced by deformations of the supporting platforms and for removal and replacement in the exact position as before.

Figure 9:
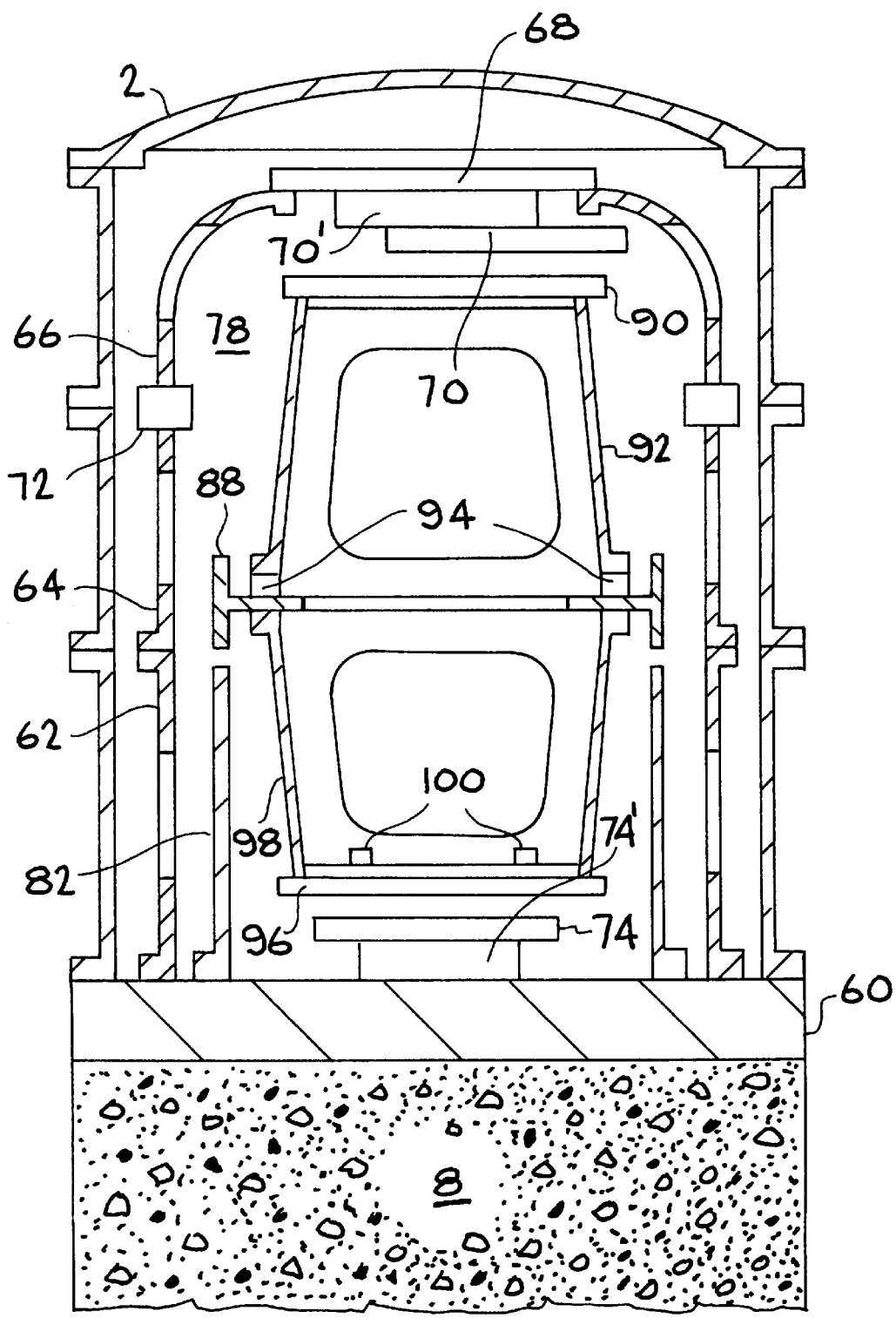
FIG. 9 illustrates the addition of a reticle metrology tray and support structure and a wafer metrology tray and its support structure located in the main chamber of FIG. 6.

FIG. 9 shows components of FIG. 7, using the same reference numerals for like components, and in addition are shown the reticle metrology tray 90 and its support structure 92 that is secured to projection optics box support ring 88. The tray 90 is mounted to the support structure 92 using kinematic mounts 94 in three places. FIG. 9 also shows wafer metrology and its attendant support structure 98, also secured to projection optics box support ring 88. Tray 96 is also attached to its support structure 98 by a set of three kinematic mounts 100.

Figure 10:
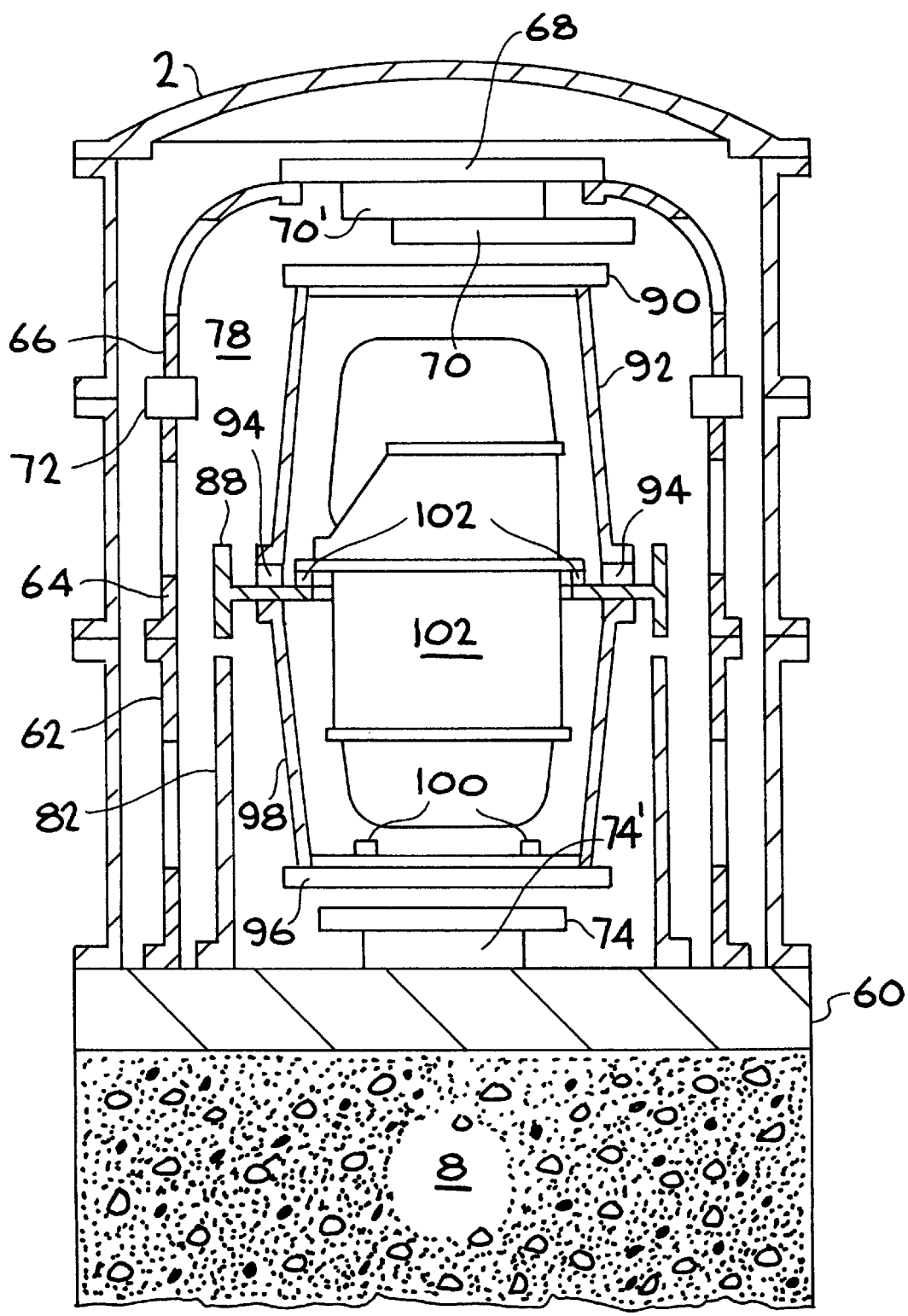
FIG. 10 illustrates the addition of a projection optics box in its isolated support ring in the main chamber of FIG. 9.

FIG. 10 shows the projection optics box 102. The projection optics box 102 is mounted in the projection optics box support ring 88. This is accomplished with three kinematic mounts 102. Great care has been taken in the design of this machine to dampen all vibrations that would degrade the desired image projections. The critical components, such as the projection optics box 102 and both the reticle metrology tray 90 and its support 92, as well as the wafer metrology tray 96 and its support 98, are all contained within the isolation system 84.

Figure 11:
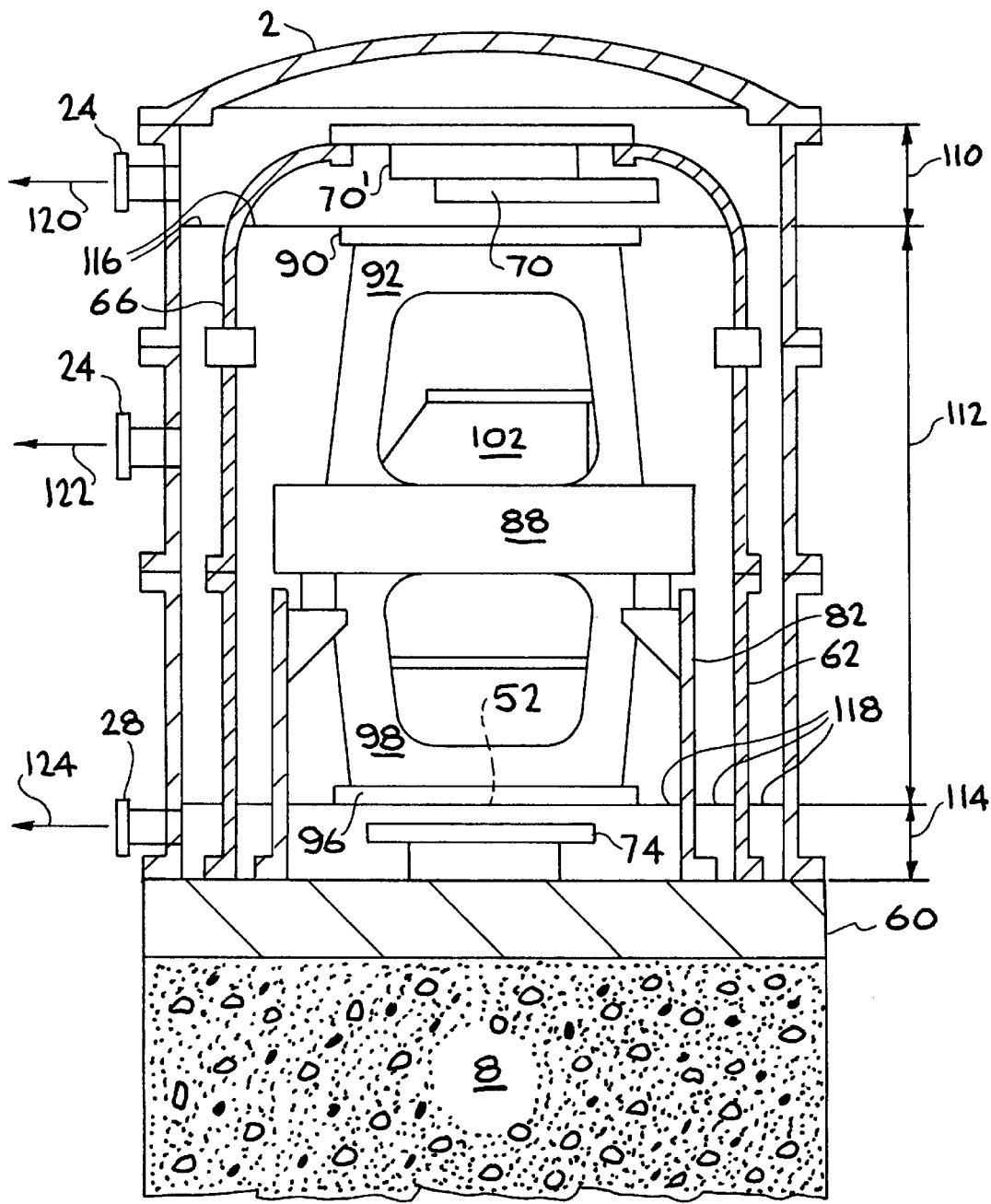
FIG. 11 illustrates the vacuum zones for the various components of the main chamber illustrated in FIG. 9.

FIG. 11 shows main chamber 2 divided into three zones, each with its own vacuum system and separated from each other by a barrier system. The reticle zone barrier is not continuous in that there are two openings, the first permits EUV beam 40, after reflecting off relay optics 46, shown in FIG. 2, to illuminate the reticle 48, and the second opening in barrier 116 permits the reflected pattern of reticle 48 to pass into the projection optics box 102. By maintaining a small pressure differential across barrier 116, that is a higher pressure in the reticle zone 110 than in projection optics zone 112, impingement of particles on the reticle 48 is minimized. The barrier 116, as shown is not continuous and bridges from main chamber 2 across to reticle bridge 66 and then to tray 90. The barrier is constructed of a very strong, but light, material, such as aluminum alloy, and designed so as to not transmit any vibrations. The pressure drop across the barrier 116 is small so that there is no large structural load to be taken by the barrier.

The wafer zone 114 is kept apart from projection optics zone 112 by a complete physical barrier 118. This is necessitated by the hydrocarbons that are given off by the resist applied to the wafer 54. If these particles were to migrate into the projection optics zone 112, they would degrade the performance of the special mirrors used in the projection optics.

Barrier 118, like barrier 116, must bridge several structures. As shown, it bridges from chamber 2 to reticle bridge 62 and continues to isolation support 82, and lastly to tray 96. Tray 96 contains a separate part of the barrier system, and that is vacuum window 52, also shown in FIG. 2. This is a special vacuum window that is transparent to EUV. This barrier may also be a clear opening with an inert gas flow that, using differential pumping would sweep released particles away from projection optics zone 112.

Figure 12:
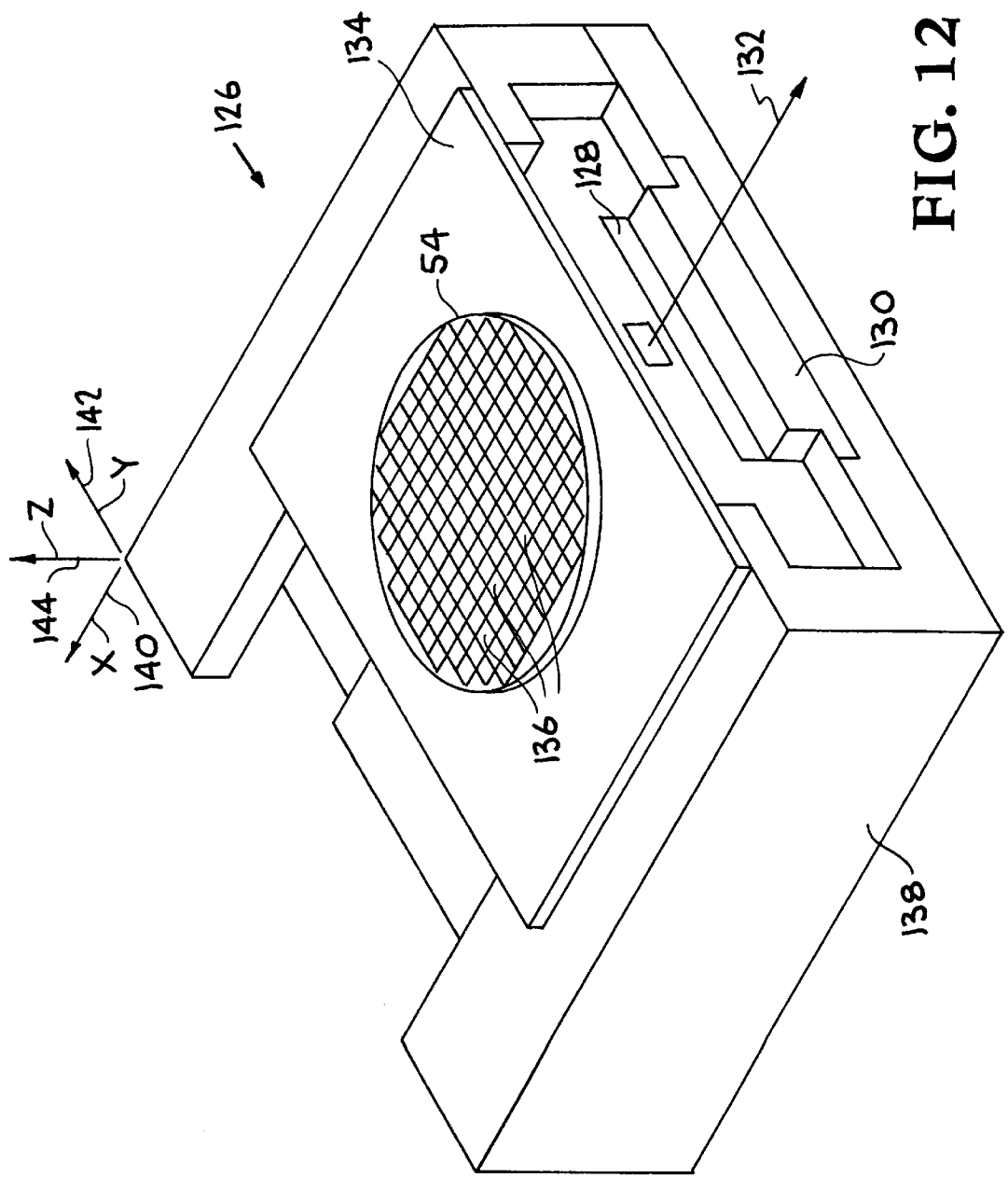
FIG. 12 illustrates a precision magnetic bearing six degree of freedom stage for the wafer support within the main chamber of FIG. 11.

FIG. 12 shows an embodiment of the wafer stage 74–74' which includes a precision magnetic bearing six degree of freedom stage 126 as indicated by the arrows X, Y, and Z. The stage has an anodized aluminum base 138, a linear motor stator 130 mounted to the base and moves the platen 134 in the X axis 140. A conventional mechanical linear slide provides the travel in the Y axis 142. The base 138 is raised or lowered by a motor, not shown, in the Z axis 144. A typical operation of the stage is to step in the X direction 10 to 20 times for a row of die sites, then a single step in the Y direction to the next row of die sites. Located between stage base 138 and platen 134 there is an array of permanent magnets that offset the mass of the platen. The platen being magnetically suspended greatly reduces the possibility of particulate contamination from moving parts rubbing each other as in a mechanical stage. The magnetic stage is also faster and more accurate and can be positioned and focused using six axes of laser metrology as shown by beam 132.

It has been shown that the present invention provides an EUVL machine for producing IC components that will enable industry to meet the forthcoming demands for such components.

While a particular embodiment of the EUVL machine and particular component embodiments have been illustrated and described, such are not intended to be limiting. Modifications and changes may become apparent to those skilled in the art, and it is intended that the invention be limited only by the scope of the appended claims.

The invention claimed is:

1. An extreme ultraviolet lithography machine, comprising:
   a pair of interconnected chambers,
   a first of said chambers including means for forming an illumination beam,
   a second of said chambers including a pair of spaced wall sections, a patterned reticle assembly, a projection optics assembly, and a wafer assembly,
   and means for directing said illumination beam into said second of said chambers and onto said patterned reticle assembly forming a patterned beam which is directed by said projection optics assembly onto said wafer assembly.

2. The machine of claim 1 wherein said means for directing said illumination beam includes a transfer tube for directing said illumination beam from said first chamber into said second chamber.

3. The machine of claim 1, wherein said second chamber is positioned so as to be at least partially located at a height greater than a height of said first chamber.

4. The machine of claim 1, wherein said means for forming said illumination beam is selected from the group consisting of a plasma generator, electric discharge, and laser energy.

5. The machine of claim 1, wherein said means for forming said illumination beam additionally includes a laser and optical means for directing energy from said laser onto said means for directing said illumination beam into said second chamber.

6. The machine of claim 5, wherein said means for directing said illumination beam includes a turning mirror, a segmented collector, and a pupil optics.

7. The machine of claim 6, wherein said means for directing said illumination beam includes an imaging mirror located in said first chamber and a grazing angle mirror located in said second chamber.

8. The machine of claim 7, wherein said means for directing said illumination beam additionally includes a filter/window assembly and a transport tube located intermediate said imaging mirror and said grazing angle mirror.

9. The machine of claim 1, wherein said first and second chambers are interconnected via an airlock valve assembly.

10. The machine of claim 1, additionally including robotics for said patterned reticle assembly and said wafer assembly.

11. The machine of claim 1, wherein said projection optics assembly includes a plurality of mirrors.

12. The machine of claim 11, wherein each of said mirrors is mounted on a kinematic mount.

13. The machine of claim 11, wherein said projection optics assembly is mounted via a plurality of isolators.

14. The machine of claim 1, wherein said patterned reticle assembly includes a plurality of kinematic mounts.

15. The machine of claim 1, wherein said second chamber is mounted on means for damping vibrational excitation.

16. The machine of claim 1, wherein said wafer assembly and said reticle assembly each include a six degree of freedom stage, said wafer assembly supporting a wafer to be exposed to said patterned beam from said reticle assembly via said projection optics assembly.

17. The machine of claim 1, additionally including means for evacuating each of said chambers.

18. The machine of claim 1, wherein second chamber is composed of a plurality of sections, each section being connected to means for evacuating same.

19. The machine of claim 1, additionally including a transparent barrier intermediate said projection optics assembly and said wafer assembly.

20. The machine of claim 1, wherein said reticle assembly and said wafer assembly are each mounted on a grounded base and a suspended carrier.

* * * * *